(12) United States Patent
Ono

(10) Patent No.: US 6,831,308 B2
(45) Date of Patent: Dec. 14, 2004

(54) SEMICONDUCTOR LIGHT DETECTING DEVICE

(75) Inventor: Reiji Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/062,743

(22) Filed: Feb. 1, 2002

(65) Prior Publication Data

US 2002/0105010 A1 Aug. 8, 2002

(30) Foreign Application Priority Data

Feb. 2, 2001 (JP) ......................................... 2001-027197

(51) Int. Cl.[7] .................. H01L 31/0328; H01L 31/0336
(52) U.S. Cl. ........................ 257/184; 257/190; 257/191; 257/196
(58) Field of Search ................................ 257/184–191, 257/196, 428, 431, 458

(56) References Cited

U.S. PATENT DOCUMENTS

| | | | | |
|---|---|---|---|---|
| 5,057,891 A | * | 10/1991 | Torikai | ........................ 357/30 |
| 5,731,213 A | | 3/1998 | Ono | |
| 5,880,489 A | * | 3/1999 | Funaba et al. | .............. 257/184 |
| 6,252,286 B1 | * | 6/2001 | Arai | ........................... 257/446 |

* cited by examiner

*Primary Examiner*—Nathan J. Flynn
*Assistant Examiner*—Joannes Mondt
(74) *Attorney, Agent, or Firm*—Hogan & Hartson, LLP

(57) ABSTRACT

A semiconductor light detecting device has a light absorbing layer; and a pn junction, carriers generated by the light absorbing layer absorbing the light in a light detecting region being detected as a photoelectric current through a depletion layer provided by applying a backward voltage to the pn junction, wherein the light detecting region in the light absorbing layer is all depleted in a slate where an operating voltage is applied.

3 Claims, 5 Drawing Sheets

SEMICONDUCTOR LIGHT DETECTING DEVICE

CROSS REFERENCE TO RELATED APPLICATIONS

This application claims benefit of priority under 35USC § 119 to Japanese Patent Application No. 2001-27197 filed on Feb. 2, 2001 in Japan, the entire contents of which are incorporated by reference herein.

BACKGROUND OF THE INVENTION

The present invention relates generally to a semiconductor light detecting device, and more particularly to a semiconductor light detecting device enabling a high-speed response in a way that keeps a light detection sensitivity in applications to optical communications and so on.

The semiconductor light detecting device is broadly used in applications to the optical communications, a variety of optical monitors and others. Purposes for converting the light into electric signals in these applications are to detect a light intensity and modulated light, observe a waveform of an optical pulse, and convert an energy as by a solar battery. Basic characteristics required of the semiconductor light detecting device are that a photoelectric conversion efficiency be high in a wavelength band of the light to be detected, that there be a response speed required, and that noises be low. Further, the semiconductor light detecting device needs to be small both in size and in weight, and low both in its operating voltage and in its price in the majority of cases.

Responding to these demands, a semiconductor light emitting device based on a pn junction diode is used. A scheme of this semiconductor light emitting device is that a backward bias is applied to the pn junction provided in the semiconductor, and photo carriers generated by a light absorption in a depletion layer therein are detected as a photoelectric current.

Over the recent years, the semiconductor light detecting device has been required to have a high-speed response characteristic of which a cut-off frequency is equal to or higher than 10 GHz in the various categories of applications such as the optical communications and so forth.

A conventional pn junction diode type semiconductor light detecting device has a problem in which the response speed of the device is hard to gain a remarkable improvement.

SUMMARY OF THE INVENTION

According to one embodiment of the present invention, there is provided a semiconductor light detecting device comprising:

a light absorbing layer; and a pn junction, carriers generated by said light absorbing layer absorbing the light in a light detecting region being detected as a photoelectric current through a depletion layer provided by applying a backward voltage to said pn junction, wherein said light detecting region in said light absorbing layer is all depleted in a state where an operating voltage is applied.

DETAILED DESCRIPTION OF THE INVENTION

Embodiments of the present invention will hereinafter be described with reference to the accompanying drawings.

First Embodiment

Figure 1:
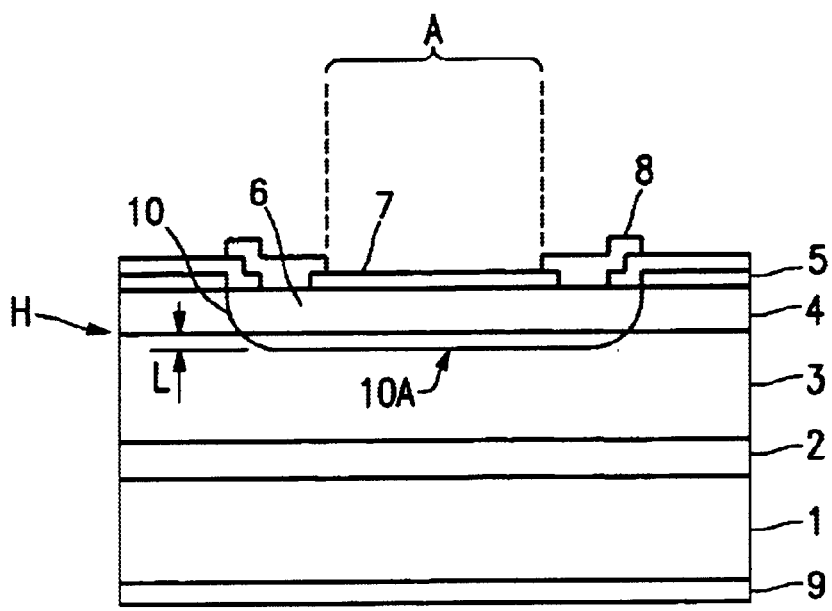
FIG. 1 is a conceptual diagram showing a sectional structure of a semiconductor light detecting device in a first embodiment of the present invention.

FIG. 1 is a conceptual diagram showing a sectional structure of a semiconductor light detecting device in a first embodiment. Namely, the semiconductor light detecting device exemplified in FIG. 1 is a specific example where the present invention is applied to an InP (indium phosphorus)-series light detecting device used in a band of wavelengths of 1.3 μm through 1.55 μm.

In the light detecting device showing in FIG. 1, an n-type InP buffer layer 2, an n-type InCaAs light absorbing layer 3, an n-type InP window layer 4 are stacked on an n-type InP substrate 1 by a method such as a VPE (vapor phase epitaxis) method or an MOCVD (metal-organic chemical vapor deposition) growth method.

The buffer layer 2 has a carrier concentration on the order of $1 \times 10^{16}$ cm$^{-3}$, and a thickness on the order of 3 μm. The n-type InGaAs light absorbing layer 3 has a carrier concentration on the order of $1 \times 10^{25}$ cm$^{-3}$, and a thickness on the order of 2 μm. The n-type InP window layer 4 has a carrier concentration on the order of $1 \times 10^{15}$ cm$^{-3}$, and a thickness on the order of 1.5 μm.

A p-type region 6 is provided by selectively diffusing Zn (zinc) into a region partially opened in an SiNx layer 5, which involves the use of a sealed tube diffusion method and so on. A thus formed pn junction 10 has its junction front (front surface) 10A provided in the light absorbing layer 3. Note that a junction area of the pn junction 10 is set to $5 \times 10^{-5}$ cm$^2$ in this specific example.

After providing the p-type region 6, a reflection preventive layer 7 is provided in the light detecting region, wherein a p-side electrode 8 and an n-side electrode 9 are respectively provided. An inside region of the p-side electrode 8 taking substantially a ring-shape as viewed in plane becomes the light detecting region for detecting incident light.

One of characteristics of the light detecting device according to the present invention is that the light absorbing layer 3 is completely depleted due to a depletion layer extending from the pn junction 10 in an operating state where a bias voltage is applied. Therefore, the junction front 10A of the pn junction is positioned in the vicinity of a hetero interface H between the n-type InP window layer 4 and the n-type InGaAs light absorbing layer 3. To be specific, a distance L between the junction front 10A and the hetero interface H is set to approximately 0.01 μm.

The reason why the junction front 10A is thus provided in the vicinity of the hetero interface H is that the p-type region in the light absorbing layer 3 exhibits a high carrier concentration with the result that the depletion layer is hard to extend. Namely, when the junction front 10A is provided in the vicinity of the hetero interface H, the light absorbing layer 3 can be completely depleted due to the depletion layer extending from the pn junction even under a normal operating bias condition.

Figure 2:
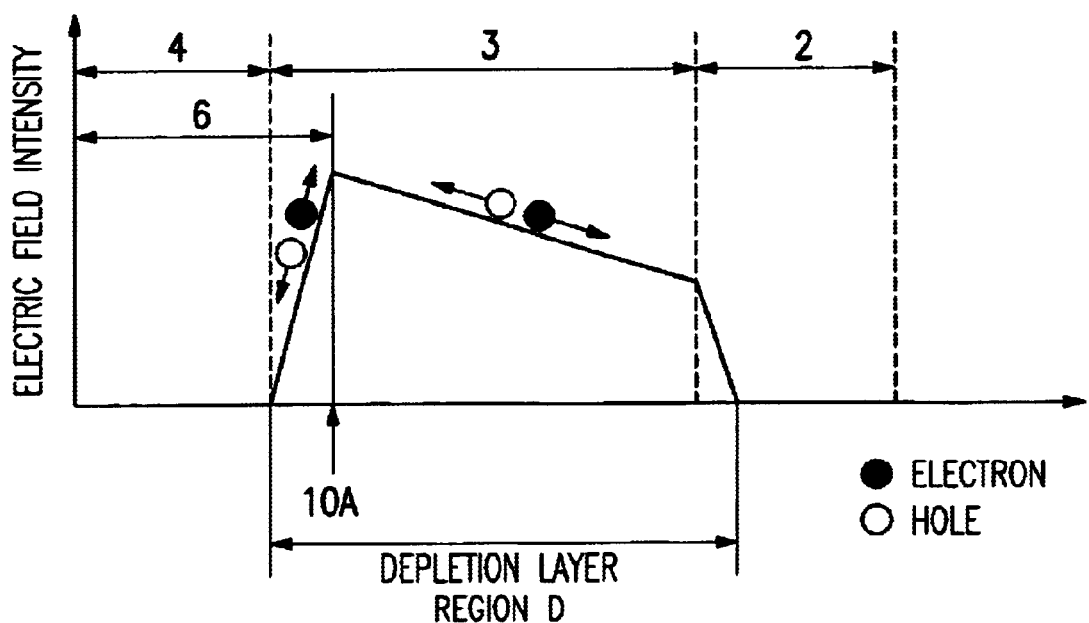
FIG. 2 is a graph showing a distribution of an electric field intensity when a backward bias voltage of 5V is applied to the light detecting device in the first embodiment.

FIG. 2 is a graph showing a distribution of an electric field intensity when a backward bias voltage 5V is applied to the light detecting device in the first embodiment.

It can be understood from FIG. 2 that a depletion layer region D extends on both sides of the junction front 10A, and the p-type InGaAs light absorbing layer 3 is completely depleted in the light detecting device in the first embodiment. Accordingly, the carriers of hole-to-electron couplings that occurred in the light absorbing layer 3 are respectively accelerated by the electric field in the depletion layer and thereby migrate at a high speed. Then, the carriers occurred in the light absorbing layer 3 are all accelerated by the electric field and migrate at a saturation drift speed.

The present inventors experimentally manufactured the InP-series light detecting device as a comparative example, and comparatively examined the characteristics thereof.

Figure 3:
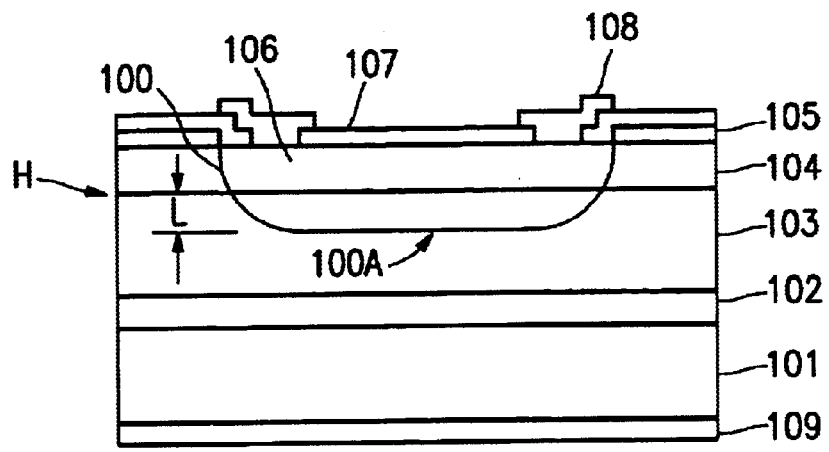
FIG. 3 is a conceptual diagram showing a sectional structure of the semiconductor light detecting device in a comparative example.

FIG. 3 is a conceptual diagram showing a sectional structure of the InP-series light detecting device given by way of the comparative example. The InP-series light detecting device in this comparative example has a structure similar to that of the light detecting device shown in FIG. 1, however, a position in which to provide the junction front of the pn junction is different. Namely, the light detecting device in this comparative example has such a structure that the n-type InP buffer layer 102, the n-type InGaAs light absorbing layer 103 and the n-type InP window layer 104 are stacked on the n-type InP substrate 101, the p-type region 106 is then formed, and further the reflection preventive layer 107, the p-side electrode 108 and the n-side electrode 109 are provided.

In this comparative example, however, the distance L between a junction front 110A of a pn junction 110 and the hetero interface H is set to 0.3 μm.

Figure 4:
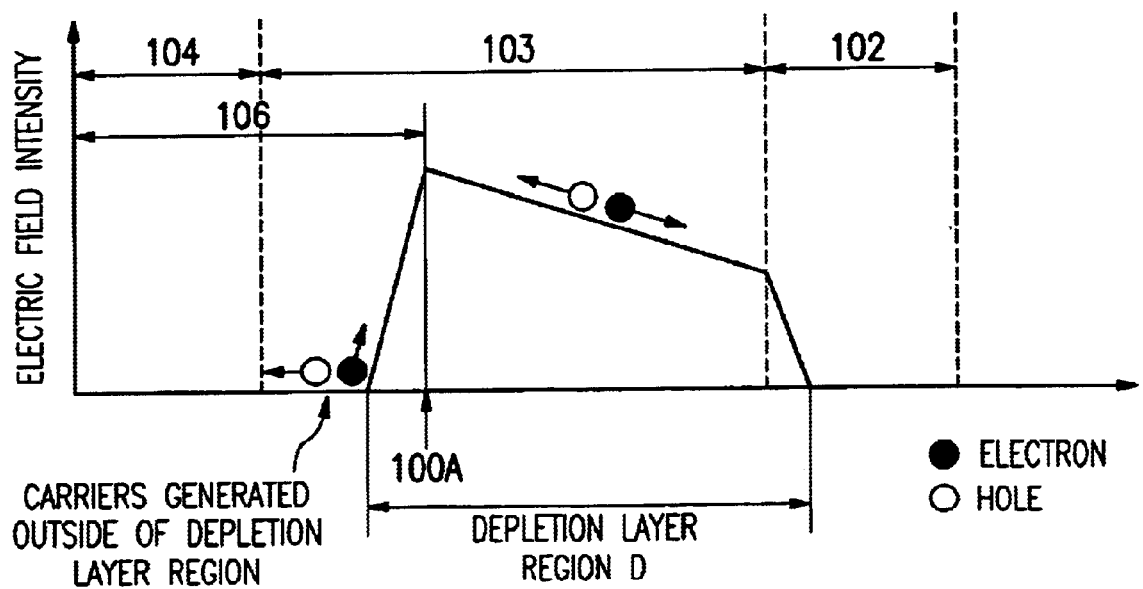
FIG. 4 is a graph showing a distribution of the electric field intensity when the backward bias voltage of 5V is applied to the light detecting device in a second embodiment.

FIG. 4 is a graph showing a distribution of the electric field intensity when the backward bias voltage 5V is applied to the light detecting device in the comparative example.

The InP-series light detecting device is normally used at the backward bias voltage on the order of 5V, an electric field intensity of the n-type InGaAs light absorbing layer 103 at that time reaches about 40 kV/cm, and the carriers migrate across the depletion layer at the saturation speed on the order of $6 \times 10^6$ (cm/sec). What can be conceived as a method for improving a response frequency of the device based on a carrier migration time restriction, is a method for decreasing a thickness of the InGaAs light absorbing layer 103. For instance, if the light absorbing layer 103 is formed as thin as 1.5 μm, a cut-off frequency in the case of considering only the carrier migration time restriction rises up to about 17.6 GHz.

If the light absorbing layer 103 is thinned down to this thickness, a light detecting sensitivity decreases to 0.8 (A/W). Further, a CR (Capacitance/Resistance) tome constant restriction becomes conspicuous due to a narrowed width (a thicknesswise dimension) of the depletion layer D, and an actual cut-off frequency decreases to approximately 7.6 GHz.

Namely, there exists a trade-off relationship between the carrier migration time restriction, the CR time constant restriction and the light detecting sensitivity that may be defined as factors for determining the response characteristic of the semiconductor light detecting device.

Moreover, the depletion layer D extending from the pn junction further extends mainly on the side of the semiconductor layer exhibiting a lower carrier concentration, and hence there might occur a state where the light absorbing layer is not completely depleted depending on the position of the pn junction. This is the case of the comparative example exemplified in FIG. 3. In this case, as seen in FIG. 4, a part of the p-type region of the light absorbing layer 103 is not depleted. A sufficient electric field is not applied to the carriers generated in this non-depleted region (indicated by 103A in FIG. 4), and hence a migration speed thereof is very low, resulting in a decline of the response characteristic of the device.

By contrast, according to the first embodiment, the junction front 10A if provided in close proximity to the hetero interface H so that the p-type region exhibiting the high carrier concentration in the light absorbing layer 3 is completely depleted under the normal bias condition. With this configuration, the light detecting region in the light absorbing layer 3 is completely depleted, and the carriers generated by the light absorption migrate across the depletion layer at the high speed, whereby the response characteristic of the light detecting device can be remarkably improved.

Second Embodiment

Next, a second embodiment of the present invention will be discussed.

Figure 5:
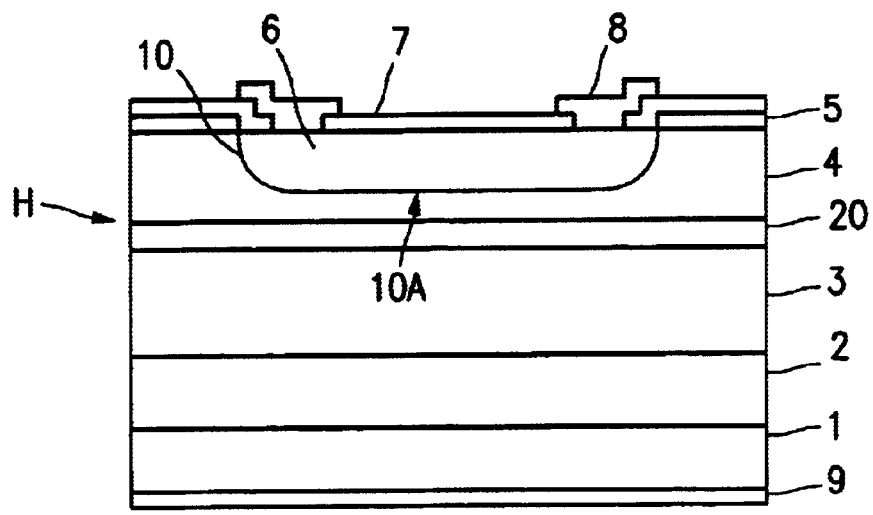
FIG. 5 is a conceptual diagram showing a sectional structure of the semiconductor light detecting device in the second embodiment of the present invention.

FIG. 5 is a conceptual diagram showing a sectional structure of the semiconductor light detecting device in the second embodiment. The semiconductor light detecting device shown in FIG. 5 may also be classified as the InP-series light detecting device used in the band of wavelengths of 1.3 μm through 1.55 μm. The same components as those shown in FIG. 1 are marked with the same reference numerals.

Namely, in the light detecting device in the second embodiment, the n-type InP buffer layer 2, the n-type InGaAs light absorbing layer 3, an n-type InGaAsP barrier relieving layer 20 and the n-type InP window layer 4 are provided on the n-type InP substrate 1. These respective layers can be stacked by the VPE method or the MOCVD growth method etc.

The buffer layer 2 has a carrier concentration on the order of, e.g., $1 \times 10^{16}$ cm$^{-3}$, and a thickness on the order of 3 μm. The n-type InGaAs light absorbing layer 3 has a carrier concentration on the order of $1 \times 10^{25}$ cm$^{-3}$, and a thickness on the order of 2 μm. The barrier relieving layer 20 has a carrier concentration on the order of $1 \times 10^{15}$ cm$^{-3}$, and a thickness on the order of 0.5 μm. The n-type InP window layer 4 has a carrier concentration on the order of $1 \times 10^{15}$ cm$^{-3}$, and a thickness on the order of 1.5 μm.

A composition of the n-type InGaAsP barrier relieving layer 20 is set so that a band gap thereof is equivalent to an energy given with a wavelength λ=1.3 μm, and this carrier layer 20 does not have a sensitivity with respect to an incident light wavelength λ=1.5 μm. Further, the composition of the barrier relieving layer 20 is set intermediate between the InP window layer 4 ad the InGaAs light absorbing layer 3, thereby making it possible to prevent the decline of the response characteristic due to a pile-up of holes at the hetero interface.

The p-type region 6 is provided by diffusing Zn (zinc) via openings selectively formed in the SiNx layer 5, which involves the use of the sealed tube diffusion method. The junction area of the pn junction may be set on the order of, e.g. $5 \times 10^{-5}$ cm$^2$.

A position of the junction front 10A of the pn junction 10 is set to about 1.4 μm away from the surface of the n-type InP window layer 4 within this window layer 4.

Figure 6:
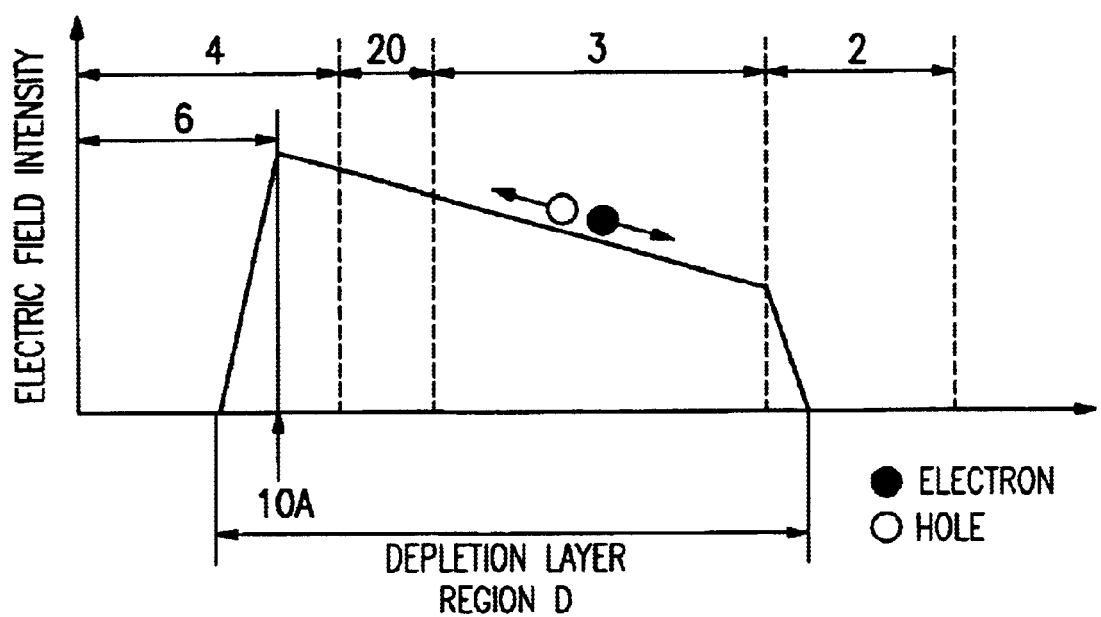
FIG. 6 is a graph showing a distribution of the electric field intensity when the backward bias voltage of 5V is applied to the light detecting device in the second embodiment.

FIG. 6 is a graph showing a distribution of the electric field intensity when the backward bias voltage 5V is applied to the light detecting device in the second embodiment.

According to the second embodiment, the junction front 10A is provided in the predetermined position within the InP window layer 4 in a way that adjusts the carrier concentration and the thickness of each of the window layer 4, the barrier relieving layer 20 and the light absorbing layer 3, whereby the light absorbing layer 3 can be all depleted when applying the operation voltage. As a result, all the carries generated in the light absorbing layer 3 are accelerated by the electric field and migrate at the saturation drift speed with the result that there is no carrier migrating at the diffusion speed, whereby a high-speed response can be attained.

Third Embodiment

Next, a third embodiment of the present invention will be explained.

Figure 7:
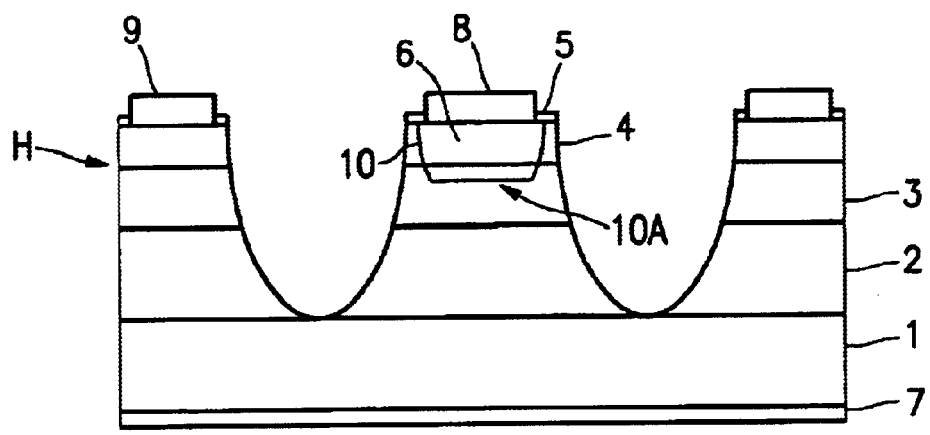
FIG. 7 is a conceptual diagram showing a sectional structure of the semiconductor light detecting device in a third embodiment of the present invention.

FIG. 7 is a conceptual diagram showing a sectional structure of the semiconductor light detecting device in the third embodiment. The semiconductor light detecting device illustrated in FIG. 7 comes under a category of a so-called [undersurface incident type flip chip]. Referring to FIG. 7, the same components as those in FIG. 1 are likewise marked with the same reference numerals.

Namely, in the light detecting device also in the third embodiment, the n-type InP buffer layer 2, the n-type InGaAs light absorbing layer 3, and an n-type InP cap layer 4 are stacked on the n-type InP substrate 1. The buffer layer 2 has a carrier concentration on the order of, e.g., $1 \times 10^{16}$ cm$^{-3}$, and a thickness on the order of 20 μm. The light absorbing layer 3 has a carrier concentration on the order of $1 \times 10^{25}$ cm$^{-3}$, and thickness on the order of 2.5 μm. The cap layer 4 has a carrier concentration on the order of $1 \times 10^{25}$ cm$^{-3}$, and a thickness on the order of 1.5 μm.

Explaining a structure of this light detecting device will be explained along with manufacturing steps, to start with, the p-type region 6 can be provided by implanting ions, i.e., Zn (zinc) into a region selectively holed in the SiNx layer 5 and thereafter effecting capless annealing at 600° C. for about 30 min. Herein a condition for the ion implantation is that an acceleration energy is 180 keV, an implantation quantity is $1 \times 10^{16}$ cm$^{-3}$, and a current density is 0.5 μAcm$^{-2}$ or under. Further, an annealing condition is set so that the junction front 10A is provided in a position that is 0.01 μm away from the hetero interface H between the cap layer 4 and the light absorbing layer 3 within this light absorbing layer 3, and the pn junction becomes an inclined type junction in which an impurity concentration gradient or the pn junction is on the order of $1 \times 10^{27}$ cm$^4$.

Moreover, in this specific example, a junction area of the pn junction 10 set to $1.3 \times 10^{-5}$ cm$^2$.

After forming the pn junction 10, a semiconductor layer peripheral to the pn junction 10 is removed down to the buffer layer 2 by etching. Then, the p-side electrode 8 is provided in the p-type region 6, and the n-side electrode 9 is provided on the cap layer 4 peripheral thereto. Further, the reflection preventive layer 7 is provided in the light detecting region on the undersurface of the substrate 1.

The light detecting device in the third embodiment receives the light from the undersurface of the substrate 1, whereby the carrier are generated in the light absorbing layer 3.

Figure 8:
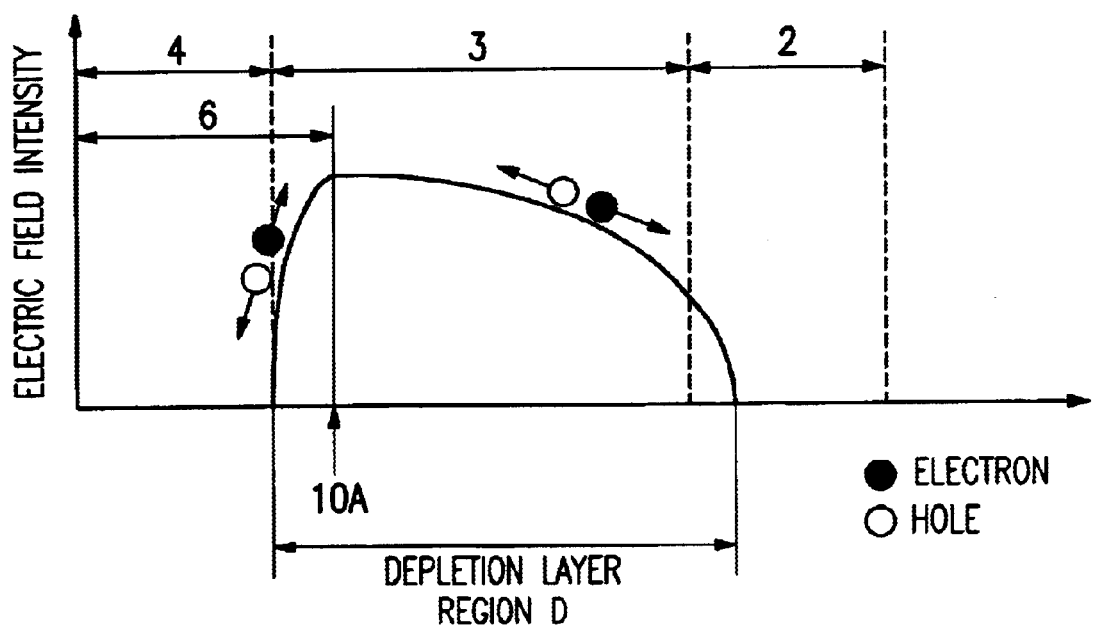
FIG. 8 is a graph showing a distribution of the electric field intensity when the backward bias voltage of 5V is applied to the light detecting device in the third embodiment.

FIG. 8 is a graph showing a distribution of the electric field intensity when the backward bias voltage 5V is applied to the light detecting device in the third embodiment.

Under this bias condition, an average electric field intensity in the light absorbing layer 3 is $4.2 \times 10^3$ V/cm, the carrier migration speed reaches $2.3 \times 10^7$ (cm/sec) that is approximately four times the saturation speed of $6 \times 10^5$ (cm/sec). The cut-off frequency based on the carrier migration time restriction is 40 GHz, and the light absorbing layer can be made thicker because of the increase in the carrier migration speed. Then, the cut-off frequency based on the CR time constant restriction is 51 GHz, and the high-speed response can be actualized without any decrease in the light detecting sensitivity.

Fourth Embodiment

Next, a fourth embodiment of the present invention will be described.

Figure 9:
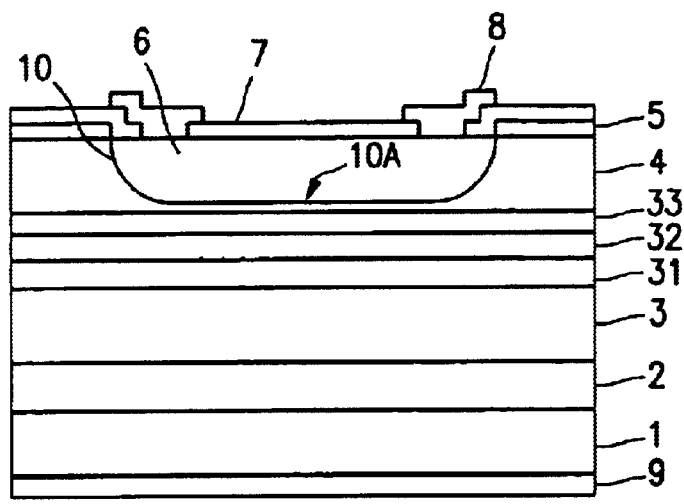
FIG. 9 is a conceptual diagram showing a sectional structure of the semiconductor light detecting device in a fourth embodiment of the present invention.

FIG. 9 is a conceptual diagram showing a sectional structure of the semiconductor light detecting device in the fourth embodiment. In FIG. 9, the same components as those in FIG. 1 are likewise marked with the same reference numerals.

The semiconductor light detecting device illustrated in FIG. 9 includes a plurality of electric field descent barrier relieving layers. To be specific, in the light detecting device in the fourth embodiment, the n-type InP buffer layer 2, the n-type InGaAs light absorbing layer 3, a first n-type InGaAsP electric field descent barrier relieving layer 31, a second n-type inGaAsP electric field descent barrier relieving layer 32, a third n-type InGaAsP electric field descent barrier relieving layer 33, and the n-type InP window layer 4 are sequentially stacked on the n-type InP substrate 1.

The buffer layer 2 has a carrier concentration on the order of, e.g., $1 \times 10^{16}$ cm$^3$, and a thickness on the order of 3 μm. The light absorbing layer 3 has a carrier concentration on the order of $1 \times 10^{15}$ cm$^{-3}$, and a thickness on the order of 2 μm. Each of the electric field descent barrier relieving layers 31 through 33 has a carrier concentration on the order of $1 \times 10^{15}$ cm$^{-3}$, and a thickness on the order of 0.1 μm. The window layer 4 has a carrier concentration on the order of $1 \times 10^{25}$ cm$^{-3}$, and a thickness on the order of 1.5 μm.

Compositions of the electric field descent barrier relieving layers 31 through 33 are adjusted so that band gaps thereof come to a light wavelengths λ=1.5 μm, 1.3 μm, 1.1 μm, and these barrier relieving layers 31, 32, 33 do not have a sensitivity with respect to an incident light wavelength λ=1.55 μm. The compositions of these barrier relieving layers 31 through 33 are set intermediate between the window layer 4 ad the light absorbing layer 3, thereby making it possible to further effectively prevent the decline of the response characteristic due to the pile-up of the holes at the hetero interface. Further, each of these barrier relieving layers 31 through 33 performs a function of decreasing the electric field intensity of the light absorbing layer 3 down to $4 \times 10^3$ V/cm.

The p-type region 6 is provided by diffusing Zn (zinc) via openings selectively formed in the SiNx layer 5, which involves the use of the sealed tube diffusion method. In this specific example, the junction area of the pn junction is set on the order of, e.g., $1.3 \times 10^{-5}$ cm$^2$. Further, a position of the junction front 10A of the pn junction 10 is set to about 1.4 μm away from the surface of the window layer 4.

Figure 10:
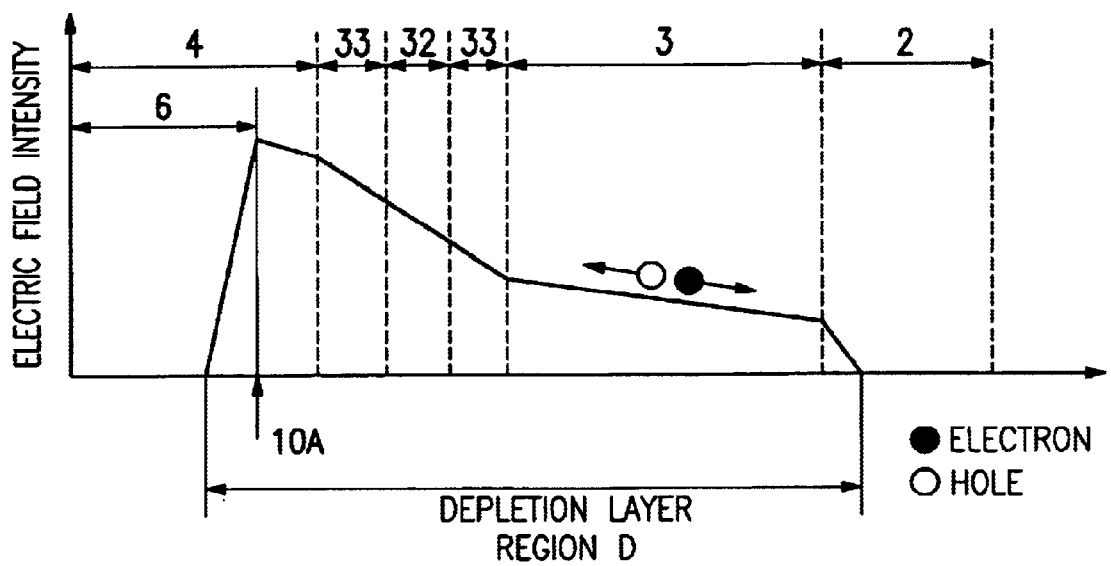
FIG. 10 is a graph showing a distribution of the electric field intensity when the backward bias voltage of 5V is applied to the light detecting device in the fourth embodiment.

FIG. 10 is a graph showing a distribution of the electric field intensity when the backward bias voltage 5V is applied to the light detecting device in this specific example. According to the fourth embodiment, the junction front 10A is provided in the predetermined position within the window layer 4 in a way that properly adjusts the carrier concentration and the thickness of each of the window layer 4 through the light absorbing layer 31, whereby the light absorbing layer 3 can be all depleted when applying the operation voltage and the decrease in the response speed due to the diffusion of the carriers can be restrained.

On the other hand, the InGaAs light absorbing layer 3 with a comparatively narrow band gap is easy to cause an avalanche multiplication of the carriers if the electric field intensity rises. This avalanche multiplication in the light absorbing layer 3 is a cause for decreasing the response speed of the light detecting device. By contrast, according to the fourth embodiment, the electric field intensity of the light absorbing layer 3 is restrained down to $4 \times 10^3$ V/cm or thereabouts by dint of action or the electric field descent through the carrier relieving layers 31, 32, 33. The decrease in the response speed can be thereby restrained in a way that completely depletes the light absorbing layer 3 and restrains the avalanche multiplication due to an excessive rise in the electric field.

In the case of the light detecting device in this specific example, the cut-off frequency based on the carrier migration time restriction is 44 GHz, the light absorbing layer can be made thicker owing to the rise in the carrier migration speed, and the cut-off frequency based on the CR time constant restriction, whereby the high-speed response can be actualized by restraining the decline due to the avalanche multiplication without any decrease in the light detecting sensitivity.

Note that the case where each of the layers 31 through 33 has both of the electric field descent action and the barrier relieving actions has been exemplified in the specific example discussed above, however, the present invention is not limited this exemplification. Namely, a semiconductor layer aiming mainly at one of the electric field descent action and the barrier relieving action, may properly be provided between the window layer 4 and the light absorbing layer 3. For example, an InP layer having only the electric field descent action may be provided under the window layer 4. Alternatively, an InGaAsP layer exhibiting, though not outstanding in its electric field descent action with a low carrier concentration, a large barrier relieving effect, may be provided between the window layer 4 and the light absorbing layer 3.

The embodiments of the present invention have been discussed so far in the way that gives the specific examples. The present invention is not, however, confined to those specific examples.

For instance, the structures and compositions of the respective layer of the light detecting device, the carrier concentrations and the conductivity types may properly changed by those skilled in the art, and the same effects as those described above can be also obtained.

As fully discussed above, according to the embodiments of the prevent invention, in the semiconductor light detecting device including the light absorbing layer and the pn junction, the light detecting region in the light absorbing layer can be completely depleted by the depletion layer extending from the junction front in the state where the operating voltage is applied, whereby it is feasible to prevent the generation of the carriers migrating at the low velocity across the light absorbing layer remaining non-depleted and to improve the response characteristic.

What is claimed is:

1. A semiconductor light detecting device comprising:
    substrate of a first conductivity type;
    a first layer of the first conductivity type formed over said substrate, said first layer absorbing light;
    a window layer of the first conductivity type formed on said first layer; and
    a region of a second conductivity type that is opposite to the first conductivity type provided in said window layer and said first layer;
    wherein said first layer and said region of said second conductivity type at least in said first layer are depleted when an operating voltage is applied to the device.

2. The semiconductor light detecting device according to claim 1, wherein a pn junction adjacent said region is an inclined type junction, and
    an electric field intensity of said light detecting region in said first layer in the state where the operating voltage is applied, is between a minimum value which causes the depletion of all of said region of said second conductivity type in said first layer and a maximum value which causes saturation of carrier drift velocity.

3. The semiconductor light detecting device according to claim 1, further comprising a second layer having a band gap larger than that of said first layer.

* * * * *